(12) United States Patent
Ikeda

(10) Patent No.: US 7,905,014 B2
(45) Date of Patent: Mar. 15, 2011

(54) MANUFACTURING METHOD OF MULTILAYER CORE BOARD

(75) Inventor: Tomoyuki Ikeda, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 409 days.

(21) Appl. No.: 11/832,378

(22) Filed: Aug. 1, 2007

(65) Prior Publication Data
US 2007/0271783 A1 Nov. 29, 2007

Related U.S. Application Data

(62) Division of application No. 11/246,157, filed on Oct. 11, 2005, now Pat. No. 7,378,602.

(30) Foreign Application Priority Data

Oct. 15, 2004 (JP) ................................. 2004-301385

(51) Int. Cl.
*H01K 3/10* (2006.01)
(52) U.S. Cl. .................. 29/852; 29/825; 29/830; 29/846
(58) Field of Classification Search .................... 29/825, 29/830, 846, 852
See application file for complete search history.

(56) References Cited

U.S. PATENT DOCUMENTS

| | | | |
|---|---|---|---|
| 5,403,672 A | 4/1995 | Urasaki et al. | |
| 6,127,633 A | 10/2000 | Kinoshita | |
| 6,548,767 B1 | 4/2003 | Lee et al. | |
| 6,767,616 B2 | 7/2004 | Ooi et al. | |
| 6,972,382 B2 | 12/2005 | Zollo et al. | |
| 2007/0209199 A1* | 9/2007 | Iijima et al. | ...................... 29/836 |

FOREIGN PATENT DOCUMENTS

| | | |
|---|---|---|
| JP | 61-114596 A | 6/1986 |
| JP | 04-340795 A | 11/1992 |
| JP | 2000-068648 A | 3/2000 |
| JP | 2002-026519 A | 1/2002 |
| JP | 2003-332752 A | 11/2003 |
| JP | 2004-006971 A | 1/2004 |
| JP | 2004-134724 | 4/2004 |

* cited by examiner

*Primary Examiner* — C. J Arbes
(74) *Attorney, Agent, or Firm* — Oblon, Spivak, McClelland, Maier & Neustadt, L.L.P.

(57) ABSTRACT

A multilayer core board 10 includes tapered first via hole conductors 51 extending from the outer surface of a first insulating layer 24 to conductive portions 42a of a power source layer 42, second via hole conductors 52 extending from the outer surface of a second insulating layer 26 to the conductive portions 42a of the power source layer 42, tapered third via hole conductors 53 extending from the outer surface of the second insulating layer 26 to conductive portions 40a of a ground layer 40, and fourth via hole conductors 54 extending from the outer surface of a center insulating layer 22 to the conductive portions 40a of the ground layer 40. The first via hole conductors 51 are tapered, and thus the interval distance to the adjacent first via hole conductor 51 is shorter than straight-shaped first via hole conductors, and thus the pitch of the first via hole conductor 51 at the positive pole side and the fourth via hole conductor 54 at the negative pole side can be sufficiently reduced. This point is applicable to the third via hole conductors 53.

5 Claims, 8 Drawing Sheets

(a) With Tapered Via Hole Conductor (b) With Straight Via Hole Conductor

MANUFACTURING METHOD OF MULTILAYER CORE BOARD

CROSS-REFERENCE TO RELATED APPLICATIONS

This application is a divisional of U.S. application Ser. No. 11/246,157, filed on Oct. 11, 2005, and is based upon and claims the benefit of priority defined in 35 U.S.C Section 119 from the prior Japanese Patent Application No. 2004-301385, filed on Oct. 15, 2004 and titled as MULTILAYER CORE BOARD AND MANUFACTURING METHOD THEREOF; the entire contents of each of which are incorporated herein by reference.

BACKGROUND OF THE INVENTION

1. Field of the Invention

The present invention relates to a multilayer core board and a method for manufacturing the same.

2. Description of the Prior Art

For example, a structure disclosed in Japanese Published Unexamined Patent Application No. 2004-134724 (FIG. 12 to FIG. 14 and FIG. 19) is known as a multilayer core board. As shown in FIG. 16, in a multilayer core board 200, a ground layer 206 having a conductive portion 206a and a non-conductive portion 206b is provided on the surface of a center insulating layer 202 containing a metal core 204, a power source layer 208 having a conductive portion 208a and a non-conductive portion 208b is provided on the back surface of the center insulating layer 202, a first insulating layer 214 is provided between the ground layer 206 and first conductive layers 210 and 212 disposed so as to face the ground layer 206, and a second insulating layer 208 is provided between the power source layer 208 and second conductive layers 216 and 218 disposed so as to face the power source layer 208. The first conductor layer 210 and the second conductive layer 216 are electrically connected to each other by a via hole conductor 222 penetrating through the multilayer core board 200 in the vertical direction thereof. The via hole conductor 222 is formed so as to pass through the non-conductive portion 206b without coming into contact with the conductor portion 206a of the ground layer 206 and pass through the conductive portion 208a of the power source layer 208. The first conductive layer 212 and the second conductive layer 218 are electrically connected to each other through a via hole conductor 224 penetrating through the multilayer core board 200 in the vertical direction. The via hole conductor 224 is formed so as to pass through the non-conductive portion 208b without coming into contact with the conductor portion 208a of the power source layer 208, and pass through the conductor portion 206a of the ground layer 206.

SUMMARY OF THE INVENTION

The present invention is directed to a multilayer core board that includes a ground layer and a power source layer which respectively have conductive portions and non-conductive portions on both surfaces of a center insulating layer respectively, a first insulating layer provided between the ground layer and a first conductive layer disposed so as to face the ground layer, and a second insulating layer provided between the power source layer and a second conductive layer disposed so as to face the power source layer. The multilayer core board of the present invention includes: tapered first via hole conductors that, while the diameter thereof is gradually reduced, pass from the first conductive layer side of the first insulating layer through the first insulating layer through the first insulating layer, the non-conductive portions of the ground layer and the center insulating layer in the thickness direction and reach the conductive portions of the power source layer, under the state that the first via hole conductors are electrically insulated from the conductive portions of the ground layer; second via hole conductors that pass from the second conductive layer side of the second insulating layer through the second insulating layer in the thickness direction and reach the conductive portions of the power source layer; tapered third via hole conductors that, while the diameter thereof is gradually reduced, pass from the second conductive layer side of the second insulating layer through the second insulating layer, the non-conductive portions of the power source layer and the center insulating layer in the thickness direction and reach the conductive portions of the ground layer, under the state that the third via hole conductors are electrically insulated from the conductive portions of the power source layer; and fourth via hole conductors that pass from the first conductive layer side of the first insulating layer through the first insulating layer in the thickness direction and reach the conductive portions of the ground layer. In the multilayer core board of the invention, the first via hole conductors and the fourth via hole conductors are alternately juxtaposed with one another and the second via hole conductors and the third via hole conductors are alternately juxtaposed with one another.

In this multilayer core board, the first via hole conductors, the conductive portions of the power source layer and the second via hole conductors which serve as positive poles, and the third via hole conductors, the conductive portions of the ground layer and the fourth via hole conductors which serve as negative poles act as through hole conductors penetrating through the multilayer core board in the vertical direction. The non-conductive portions of the ground layer are formed so as to surround the first via hole conductors with clearances through which the conductive portions of the ground layer and the first via hole conductors are electrically insulated from one another, and thus they correspond to clearance holes. Here, comparing a case where the shape of each first via hole conductor is a tapered shape and a case where the shape of each first via hole conductor is a straight shape on the assumption that the area of each first via hole conductor at the first conductor layer side of the first insulating layer is set to a predetermined size and the clearance is set to a predetermined distance, the transverse cross-sectional area of the portion of the first via hole conductor which passes through the non-conductive portion of the ground layer is smaller in the case of the tapered shape than in the case of the straight shape, so that the first via hole conductors can be closer to the adjacent conductive portions. Therefore, the tapered first via hole conductors can be more densely arranged than the straight-shaped first via hole conductors. This is applicable to the third via hole conductors. Accordingly, the pitch of the first via hole conductors and the second via hole conductors at the positive pole side and the pitch of the third via hole conductors and the fourth via hole conductors at the negative pole side, which are alternately juxtaposed with one another can be sufficiently reduced. As a result the loop inductance is reduced, and thus the impedance is reduced, so that the delay in power supply to the transistors of a mounted IC chip is suppressed.

The second via hole conductors may be designed to reach the conductive portions of the power source layer while the diameter thereof is gradually reduced from the second conductive layer, and the fourth via hole conductors may be designed to reach the conductive portions of the ground layer while the diameter thereof is gradually reduced from the first conductive layer. Furthermore, the area where the first via hole conductors and the fourth via hole conductors are alternately juxtaposed with one another and the second via hole conductors and the third via hole conductors are alternately juxtaposed with one another preferably contains at least an area just below the IC chip.

The present invention is also directed to a method for manufacturing a multilayer core board that includes the steps of: (a) patterning conductive thick film provided on both surfaces of a center insulating layer to form a ground layer and a power source layer each having conductive portions and hole portions; (b) covering the whole of the ground layer with insulating material while filling the hold portions of the ground layer with the insulating material to form non-conductive portions, thereby forming a first insulating layer, and covering the whole of the power source layer with insulating material while filling the hole portions of the power source layer with the insulating material to form non-conductive portions, thereby forming a second insulating layer; and (c) forming first via holes by using a laser so that the first via holes pass through the first insulating layer, the non-conductive portions of the ground layer and the center insulating layer and reaches the conductive portions of the power source layer without exposing the conductive portions of the ground layer while the first via holes are gradually reduced in diameter from the outer surface of the first insulating layer, forming second via holes by using a laser so that the second via holes pass from the outer surface of the second insulating layer through the second insulating layer and reaches the conductive portions of the power source layer, forming third via holes by using a laser so that the third via holes pass through the second insulating layer, the non-conductive portions of the power source layer and the center insulating layer and reaches the conductive portions of the ground layer without exposing the conductive portions of the power source layer while the third via holes are reduced in diameter from the outer surface of the second insulating layer, where the third via holes and the second via holes are alternately juxtaposed with one another, and forming fourth via holes by using a laser so that the fourth via holes pass from the outer surface of the first insulating layer through the first insulating layer and reaches the conductive portions of the ground layer. The method further includes the steps of: (d) covering at least inner walls of the first to fourth via holes with conductors to form first to fourth via holes conductors; and (e) forming a first conductive layer on the outer surface of the first insulating layer so as to be electrically connected to the first and fourth via hole conductors, and also forming a second conductive layer on the outer surface of the second insulating layer so as to be electrically connected to the second and third via hole conductors.

According to this manufacturing method, since first to fourth via holes are formed by a laser in a step (c), it is easy to reduce the diameter of the via holes, it is easy to form tapered via holes whose diameter is gradually reduced inwardly from the outer surface of the first insulating layer or the outer surface of the second insulating layer, and it is also easy to reduce the pitch between the via holes. Accordingly, this manufacturing method is suitable for manufacturing the multilayer core board of the present invention. In the step (c), the third via holes are formed so that the third via holes and the second via holes are alternately arranged, and also the fourth via holes are formed so that the fourth via holes and the first via holes are alternately arranged. However, the via holes may be formed so as to be alternately arranged over the whole area of the board or in a partial area of the board (for example, an area just below a mounted IC chip).

DETAILED DESCRIPTION OF THE INVENTION

In the multilayer core board of the present invention, either one of the first conductive layer and the second conductive layer may contain a group of pads provided so as to face a plurality of power source terminals and ground terminals of a flip-chip mounted IC chip. In this construction, the inter-terminal distance between the power source terminal and the ground terminal of the IC chip and the inter-pad distance of the multilayer core board are coincident with each other, and thus the IC chip can be directly mounted on the multilayer core board without being wired around in the horizontal direction, so that the distance of a wire for supplying power to the IC chip can be shortened. As a result, the loop inductance is reduced, and thus the impedance is reduced, so that the delay in power supply to transistors of the mounted IC chip is more unlikely.

In the multilayer core board of the present invention, the tapered first via hole conductors and the third via hole conductors are preferably designed so that the ratio d/D of a small bottom diameter d and a large top diameter D satisfies $0.1 \leq d/D \leq 0.9$. If the ratio d/D is less than 0.1, the bottom diameter d is excessively small, resulting in an excessive increase in electrical resistance or lowering of reliability of electrical connections, and thus this condition is unfavorable. If the ratio d/D exceeds 0.9, the electrical insulation is lowered when the pitch between the via holes is sufficiently reduced, and thus this condition is also unfavorable.

It is preferable for the multilayer core board of the present invention that the ground layer and the power source layer are formed to be thicker than the first conductive layer and the second conductive layer. Under this condition, the electrical resistance values of the power source wire and the ground wire are lowered, the power supply to the transistors of the mounted IC chip is stabilized. Furthermore, the strength of the multilayer core board is increased by the thick ground layer and power source layer.

In the multilayer core board of the present invention, it is preferred that via holes of the first to fourth via hole conductors are formed by laser processing. This is because the laser makes it easy to design the via holes in a tapered shape and reduce the via hole diameter.

In the multilayer core board of the present invention, it is preferable that the surfaces of the conductive portions of the ground layer that face the first via hole conductors are designed as tapered surfaces having substantially the same taper angle as the first via hole conductors, and surfaces of the conductive portions of the power source layer that face the third via hole conductors are designed as tapered surfaces having substantially the same taper angle as the third via hole conductors. With this construction, the facing distance between the first via hole conductor at the positive side and the conductive portion of the ground layer at the negative side, and the facing distance between the conductive portion of the power source layer at the positive side and the third via hole conductor at the negative side are lengthened, so that the loop inductance is reduced and the impedance is reduced. As a result, the delay in the power supply to the transistors of the mounted IC chip is more remarkably suppressed.

In the multilayer core board of the present invention, unevenness may be formed on at least either the surfaces of the conductive portions of the ground layer that face the first via hole conductor or the surfaces of the conductive portions of the first via hole conductors that face the conductive portions of the ground layer, and unevenness may be formed on at least either the surfaces of the conductive portions of the power source layer that face the third via hole conductors and the surfaces of the third via hole conductors that face the conductive portions of the power source layer. With the above construction, the facing area between the first via hole conductor at the positive side and the conductive portion of the ground layer at the negative side and the facing area between the conductive portion of the power source at the positive side and the third via hole conductor at the negative side are increased, so that the loop inductance is reduced and the impedance is reduced. As a result, the delay in the power supply to the transistors of the mounted IC chip is more remarkably suppressed.

DESCRIPTION OF THE PREFERRED EMBODIMENTS

Figure 1:
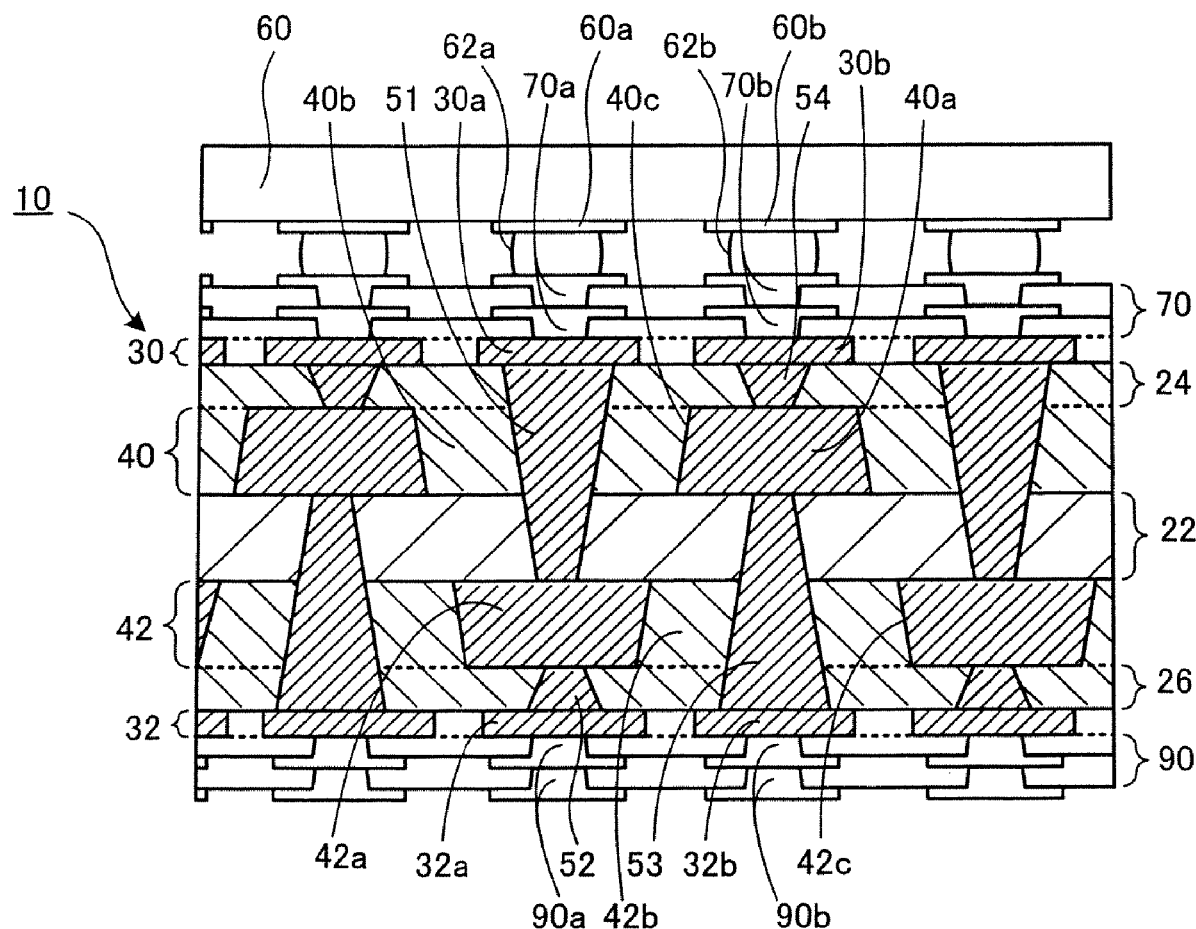
FIG. 1 is a cross-sectional view showing a use state of a multilayer core board of an embodiment.
Figure 2:
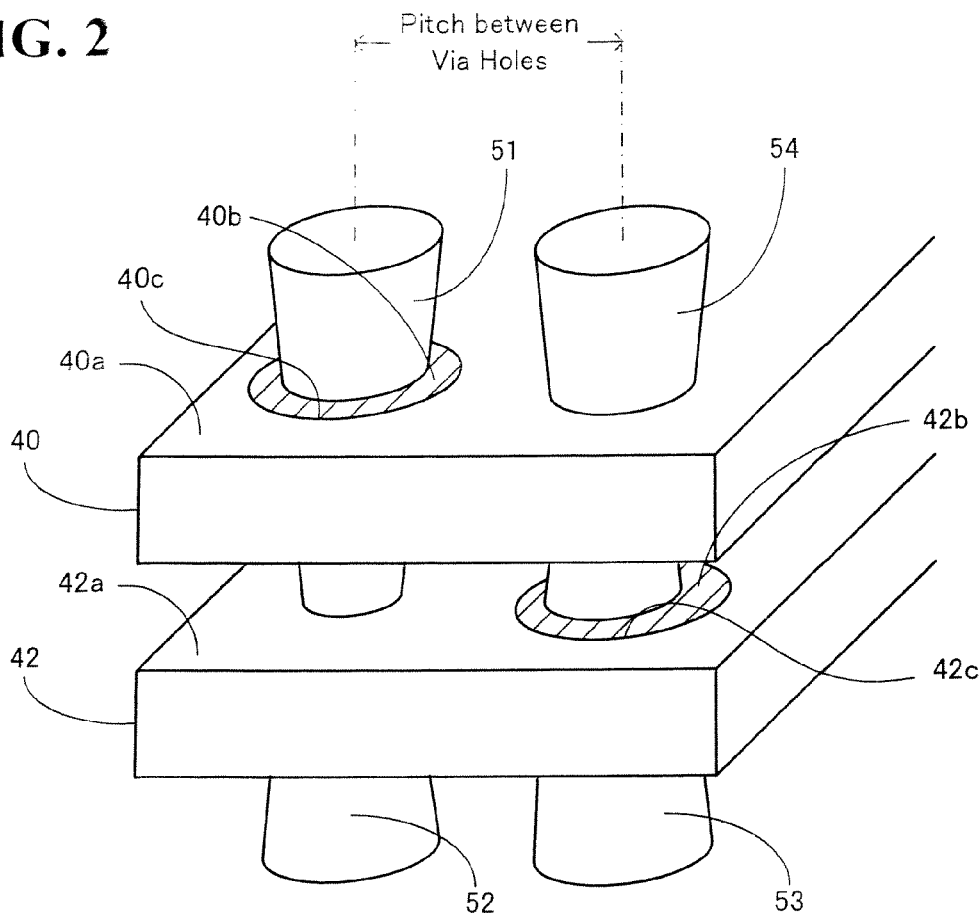
FIG. 2 is a perspective view showing the positional relationship of each via hole conductor, a ground layer and a power source layer.
Figure 3:
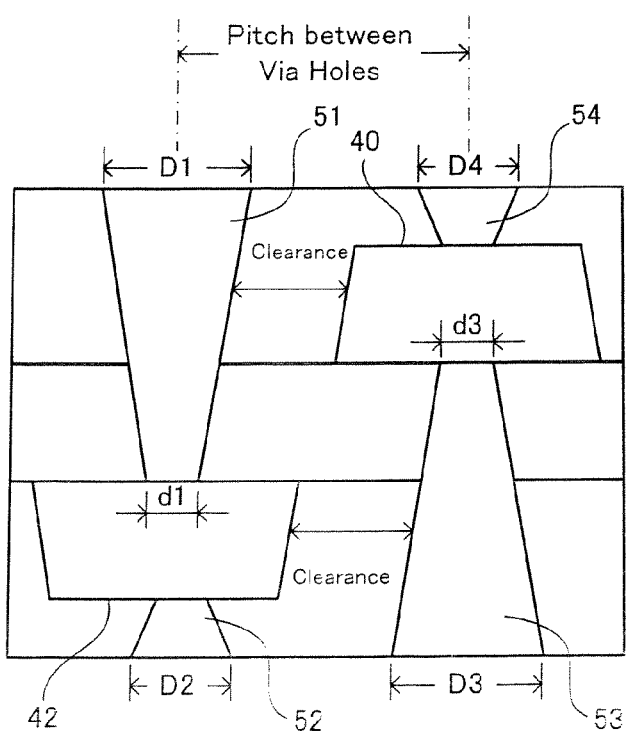
FIG. 3 is a cross-sectional view showing a use state of a printed wiring board.
Figure 4:
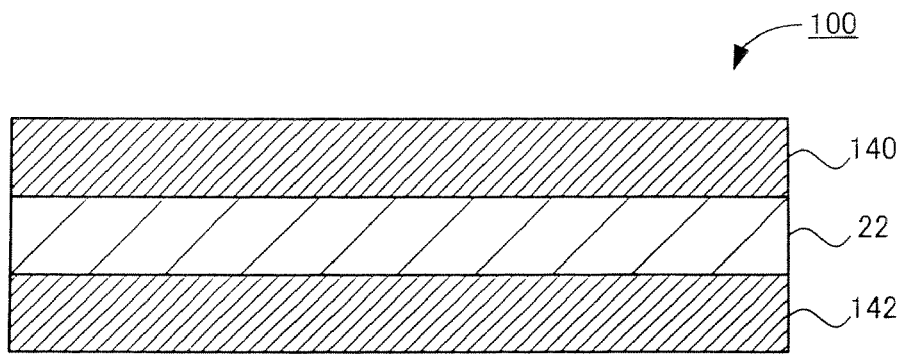
FIG. 4 is a cross-sectional view showing a double-sided copper-clad laminated plate.

Embodiments of the present invention will be now described. FIG. 1 is a cross-sectional view showing a use state of a multilayer core board according to an embodiment of the present invention, FIG. 2 is a perspective view showing the positional relationship of each via hole conductor, a ground layer and a power source layer, and FIG. 3 is a cross-sectional view showing a top diameter and a bottom diameter of each via hole conductor.

As shown in FIG. 1, the multilayer core board 10 includes a center insulating layer 22, a ground layer 40 that is provided on the surface of the center insulating layer 22 and has conductive portions 40a and non-conductive portions 40b, a power source layer 42 that is provided on the back surface of the center insulating layer 22 and has conductive portions 42a and non-conductive portions 42b, a first insulating layer 24 provided between the ground layer 40 and a first conductive layer 30 disposed so as to face the ground layer 40, and a second insulating layer 26 provided between the power source layer 42 and a second conductive layer 32 disposed so as to face the power source layer 42. The multilayer core board 10 further includes first via hole conductors 51 for electrically connecting power source pads 30a of the first conductive layer 30 to the conductive portions 42a of the power source layer 42, second via hole conductors 52 for electrically connecting power source pads 32a of the second conductor layer 32 to the conductive portions 42a of the power source layer 42, third via hole conductors 53 for electrically connecting ground pads 32b of the second conductive layer 32 to the conductive portions 40a of the ground layer 40, and fourth via hole conductors 54 for electrically connecting ground pads 30b of the first conductive layer 30 to the conductive portions 40a of the ground layer 40.

The center insulating layer 22 is an insulating substrate including a substrate formed by impregnating and curing thermosetting resin such as epoxy resin, BT resin or the like into glass cloth or glass nonwoven cloth. The first insulating layer 24, the second insulating layer 26, the non-conductive portions 40b of the ground layer 40 and the non-conductive portions 42b of the power source layer 42 may be formed of the same material as the center insulating layer 22, or insulating resin containing neither glass cloth nor glass nonwoven cloth, or insulating resin containing inorganic filler such as glass, alumina, zirconia or the like. In this embodiment, they are formed of insulating resin containing inorganic filler.

The ground layer 40 includes the conductive portions 40a formed of copper thick film on the surface of the center insulating layer 22 and the non-conductive portions 40b formed by filling insulating resin in taper holes 40c formed in the copper thick film. The taper holes 40c are formed so as to be reduced in diameter toward the center insulating layer 22.

The power source layer 42 includes the conductive portions 42a formed of copper thick film on the back surface of the center insulating layer 22 and the non-conductive portions 42b formed by filling insulting resin in taper holes 42c formed in the copper thick film. The taper holes 42c are designed to be reduced in diameter toward the center insulating layer 22.

The copper thick film constituting the ground layer 40 and the power source layer 42 is formed to be larger in thickness than the first conductive layer 30 and the second conductive layer 32. In this embodiment, the ground layer 40 and the power source layer 42 are substantially solid patterns, however, a signal wire pattern may be formed at a part of each of the conductive portions 40a and 42a.

The first insulating layer 24 is formed so as to cover the outer surface of the ground layer 40. When insulating resin is coated or the like on the outer surface of the ground layer 40 to form the first insulating layer 24, a part of the insulating resin is filled in taper holes 40c formed in the ground layer 40, whereby the non-conductive portions 40b of the ground layer 40 are formed. Insulation needs to be secured for the non-conductive portions 40, and thus it is preferable that insulating resin containing neither glass cloth nor glass nonwoven cloth is used as the material of the first insulating layer 24. Accordingly, plating is prevented from sinking along the glass in the non-conductive portions 40b, and the insulation from the first via hole conductors 51 is enhanced. The first conductive layer 30 containing the power source pads 30a and the ground pads 30b is formed on the outer surface of the first insulating layer 24. The power source pads 30a and the ground pads 30b are provided so as to face power source terminals 60a and ground terminals 60b of the IC chip 60.

The second insulating layer 26 is formed so as to cover the back surface of the power source layer 42. When insulating resin is coated or the like on the outer surface of the power source layer 42 to form the second insulating layer 26, a part of the insulating resin is filled in the taper holes 42c formed in the power source layer 42, whereby the non-conductive portions 42b of the power source layer 42 are formed. Insulation needs to be secured for the non-conductive portions 42b, and thus it is preferable that insulating resin containing neither glass cloth nor glass nonwoven cloth is used as the material of the second insulating layer 26. Accordingly, plating is prevented from sinking along the glass in the non-conductive portions 42b, and the insulation from the third via hole conductors 53 is enhanced. The second conductive layer 32 containing the power source pads 32a and the ground pads 32b is formed on the outer surface of the second insulating layer 26. The power source pads 30a and the ground pads 30b are provided so as to face power source terminals and ground terminals of a printed wiring board (not shown).

The first via hole conductors 51 are tapered conductors, while the diameter thereof is gradually reduced from the power source pads 30a formed on the outer surface of the first insulating layer 24, and pass through the first insulating layer 24, the non-conductive portions 40b of the ground layer 40 and the intermediate insulating layer 22 in the thickness direction while they are electrically insulated from the conductive portions 40a of the ground layer 40, and then reach the conductive portions 42a of the power source layer 42. The first via hole conductors 51 are designed so that the ratio d1/D1 of a small bottom diameter d1 and a large top diameter D1 (see FIG. 3) satisfies $0.1 \leq d1/D1 \leq 0.9$. The second via hole conductors 52 are likewise tapered conductors, while the diameter thereof is gradually reduced from the power source pads 32a formed on the outer surface of the second insulating layer 26, and pass through the second insulating layer 26 in the thickness direction and reach the conductive portions 42a of the power source layer 42. The first via hole conductors 51, the conductive portions 42a of the power source layer 42 and the second via hole conductors 52 can be regarded as through hole conductors at the positive pole side that pass through the multilayer core board 10 in the thickness direction.

The non-conductive portions 40b of the ground layer 40 are areas surrounding the first via hole conductors 51 with insulating resin in order to secure the electrical insulation between the first via hole conductors 51 and the conductive portions 40a of the ground layer 40, and the non-conductive portions 40b form so-called clearance holes (also called inverse lands). The surfaces of the conductive portions 40a of the ground layer 40 which face the first via hole conductors 51 are designed as tapered surfaces having substantially the same taper angle as the first via hole conductors 51. As a result, the interval between each first via hole conductor 51 and each conductive portion 40a of the ground layer 40 keeps a substantially constant clearance (see FIG. 3) in the thickness direction at all times. This clearance is set to such a value that the electrical insulation between the first via hole conductors 51 and the ground layer 40 can be secured, and the value can be experimentally determined. Furthermore, minute unevenness is formed on the surfaces of the conductive portions 40a of the ground layer 40 which face the first via hole conductors 51, and the surfaces of the first via hole conductors 51 which face the conductive portions 40a in order to increase the surface area of each of these surfaces.

The third via hole conductors 53 are tapered conductors, while the diameter thereof is gradually reduced from the ground pads 32b formed on the outer surface of the second insulating layer 26, and pass through the second insulating layer 26, the non-conductive portions 42b of the power source layer 42 and the center insulating layer 22 in the thickness direction while electrically insulted from the conductive portions 42a of the power source layer 42, and then reach the conductive portions 40a of the ground layer 40. The third via hole conductors 53 and the second via hole conductors 52 are alternately disposed in a lattice-shaped or staggered arrangement. Furthermore, the third via hole conductors 53 are designed so that the ratio d3/D3 of the small bottom diameter d3 and the large top diameter D3 (see FIG. 3) satisfies $1 \leq d3/D3 \leq 0.9$. The fourth via hole conductors 54 are likewise tapered conductors, while the diameter thereof is gradually reduced from the ground pads 30b formed on the outer surface of the first insulating layer 24, and pass through the first insulating layer 24 in the thickness direction, and then reach the conductive portions 40a of the ground layer 40. The fourth via hole conductors 54 and the first via hole conductors 51 are alternately disposed in a lattice or staggered arrangement. The third via hole conductors 53, the conductive portions 40a of the ground layer 40 and the fourth via hole conductors 54 can be regarded as through hole conductors penetrating through the multilayer core board 10 in the thickness direction.

The non-conductive portions 42b of the power source layer 42 are areas surrounding the third via hole conductors 51 with insulating resin in order to secure the electrical insulation between the third via hole conductors 53 and the conductive portions 42a of the power source layer 42, and the non-conductive portions 42b form so-called clearance holes. The surfaces of the conductive portions 42a of the power source layer 42 which face the third via hole conductors 53 are designed as tapered surfaces having substantially the same taper angle as the third via hole conductors 53. As a result, the interval between each third via hole conductor 53 and each of the conductive portions 42a of the power source layer 42 keeps a substantially constant clearance (see FIG. 3) in the thickness direction at all times. This clearance is set to such a value that the electrical insulation between each third via hole conductor 53 and the power source layer 42 can be secured, and the value can be experimentally determined. Furthermore, minute unevenness is formed on the surfaces of the conductive portions 42a of the power source layer 42 which face the third via hole conductors 53 and the surfaces of the third via hole conductors 53 which face the conductive portions 42a in order to increase the surface area of each of these surfaces.

In this embodiment, the top diameter D2 of the second via hole conductors 52 is set to be equal to the top diameter D3 of the third via hole conductor 53, and the top diameter D4 of the fourth via hole conductors 54 is set to be equal to the top diameter D1 of the first via hole conductors 51. Here, the first to fourth via hole conductors 51 to 54 are formed by filling copper as conducting metal into tapered via holes formed by laser processing. However, the via hole conductors may be designed in such a cup-shape by covering only the bottom surfaces and inner walls of the tapered via holes with conducting metal. In this case, insulating resin may be filled in the cup-shaped conducting metal, or conductive resin may be filled in the cup-shaped conducting metal. The via holes are preferably formed by filling copper in the tapered via holes. This is because if the volume of the via hole conductor is increased the resistance of the via hole conductors is lowered, so that power can be instantaneously supplied to the transistors of the IC chip 60.

The power source pads 30a and the ground pads 30b constituting the first conductive layer 30 are provide so as to face the power source terminals 60a and the ground terminals 60b of the flip-chip mounted IC chip 60. In this embodiment, a build-up layer 70 is formed on the surface of the multilayer core board 10. In the build-up layer 70 are formed via hole conductors 70a for connecting the power source pads 30a and the power source terminals 60a of the IC chip 60 disposed just above the power source pads 30a via soldering bumps 62a, and via hole conductors 70b for connecting the ground pads 30b and the ground terminals 60b of the IC chip 60 disposed just above the ground pads 30b via soldering bumps 62b.

The power source pads 32a and the ground pads 32b constituting the second conductive layer 32 are provided so as to face the power source terminals and ground terminals of a printed wiring board (not shown). In this embodiment, a build-up layer 90 is formed on the back surface of the multilayer core board 10. In the build-up layer 90 are formed via hole conductors 90a for connecting the power source pads 32a to the power source terminals of the printed wiring board (not shown) disposed just below the power source pads 32a, and via hold conductors 90b for connecting the ground pads 32b to the ground terminals of the printed wiring board (not shown) disposed just below the ground pads 32b. The pitch between the power source pads 32a and the ground pads 32b on the back surface of the multilayer core board 10 may be expanded by using the build-up layer 90.

Signal terminals of the IC chip 60 are drawn to the outside by a conductor pattern in the build-up layer 70, passed through wires penetrating through the multilayer core board 10 in the vertical direction, and then connected to the conductor pattern in the build-up layer 90.

The multilayer core board 10 thus constructed enables power supply from a printed wiring board (not shown) to the IC chip 60 and reception/transmission of signals between the printed wiring board and the IC chip 60. Furthermore, power supplied via the printed wiring board is supplied to the IC chip 60 through the shortest wire of the build-up multilayer wiring board in which the build-up layers 70 and 90 are laminated on the multilayer core board 10.

The method for manufacturing the multilayer core board 10 will be next described with reference to FIG. 4 to FIG. 12. First, a double-sided copper-clad laminated plate 100 having a heat-resisting grade (FR grade) of FR-4 is prepared (see FIG. 4). The double-sided copper-clad laminated plate 100 is formed by laminating copper thick films 140 and 142 of 25 μm to 200 μm (preferably 45 μm to 100 μm) in thickness on both surfaces of the center insulating layer 22 formed of glass-cloth-based epoxy resin of 0.03 mm to 0.3 mm (preferably 0.03 mm to 0.13 mm). As the glass-cloth-based epoxy resin, preferably used is a 2 ply glass cloth, that is, a two-layered laminated article 2 ply glass cloth has high strength, and thus the multilayer core board 10 having excellent flatness is achieved, the thickness of the conductor circuit of the build-up layer formed on the multilayer core board 10 and the thickness of the insulating layer are easily made uniform, so that the impedance can be easily matched.

Figure 5:
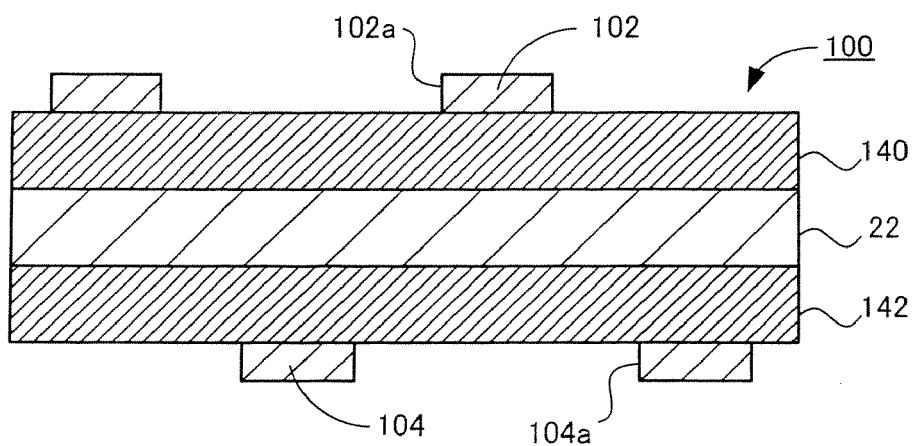
FIG. 5 is a cross-sectional view showing the procedure of manufacturing the multilayer core board.
Figure 6:
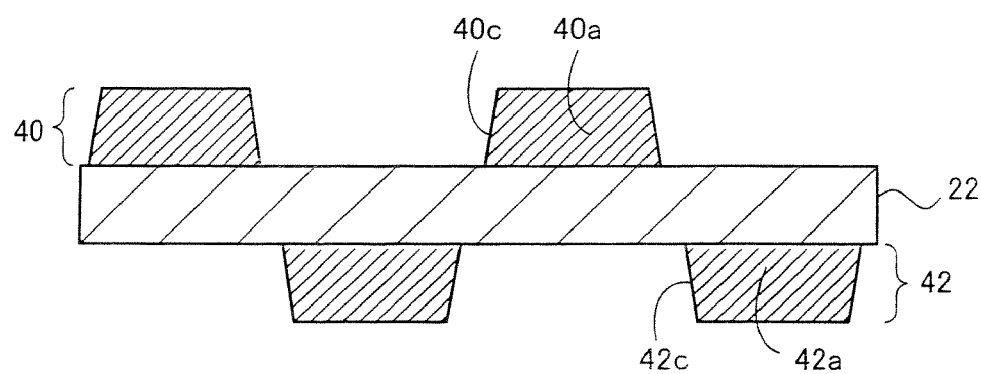
FIG. 6 is a cross-sectional view showing the procedure of manufacturing the multilayer core board.

After dry film as a photoresist is laminated on both surfaces of the double-sided copper-clad lamination plate 100, it is exposed to light through a pattern mask and then developed to form patterned resists 102 and 104 having a plurality of open holes 102a and 104a (see FIG. 5). The portions of the copper thick film 140 and 142 which are not covered by the patterned resists 102 and 104, that is, the portions exposed through the open holes 102a and 104a are removed by etching (in this case, spray etching carried out by swinging a full cone nozzle). The exposed surface is treated by alkaline oxidation treatment agent to form minute unevenness on the exposed surface (the surface which will face the via hole conductors in the future), and then the patterned resists 102 and 104 are exfoliated (see FIG. 6). The formation of the unevenness may be carried out after the patterned resists 102 and 104 are exfoliated. Accordingly, the copper thick film 140 at the surface side becomes the ground layer 40 in which the taper holes 40c disposed in a staggered or lattice-shaped arrangement are gradually reduced in diameter toward the center insulting layer 22, and the copper thick film 142 at the back surface side becomes the power source layer 42 in which the taper holes 42c are disposed in a staggered or lattice-shaped arrangement are gradually reduced in diameter toward the center insulating layer 22. The staggered or lattice-shaped arrangement of the taper holes 40c and 42c may be formed in only the area just below the IC chip 60, or over the whole area of the board. The portions of the ground layer 40 other than the taper holes 40c become the conductive portions 40a, and the portions of the power source layer 42 other than the taper holes 42c become the conductive portions 42a. The conductive portions 40a and 42a are roughened so that the surface areas thereof are increased. These taper holes 40c and 42c are provided at only the portions just below the power source terminals 60a and the ground terminals 60b of the IC chip 60, and the other portions are substantially solid patterns and partially provided with borings through which wires and signal through holes pass.

Figure 7:
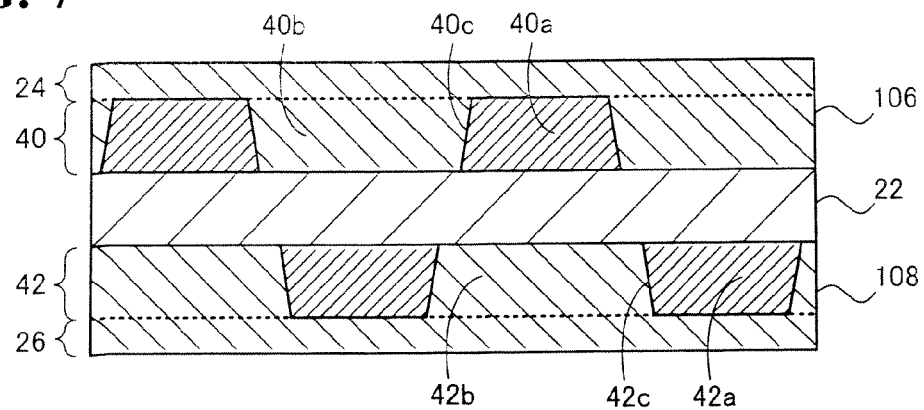
FIG. 7 is a cross-sectional view showing the procedure of manufacturing the multilayer core board.
Figure 8:
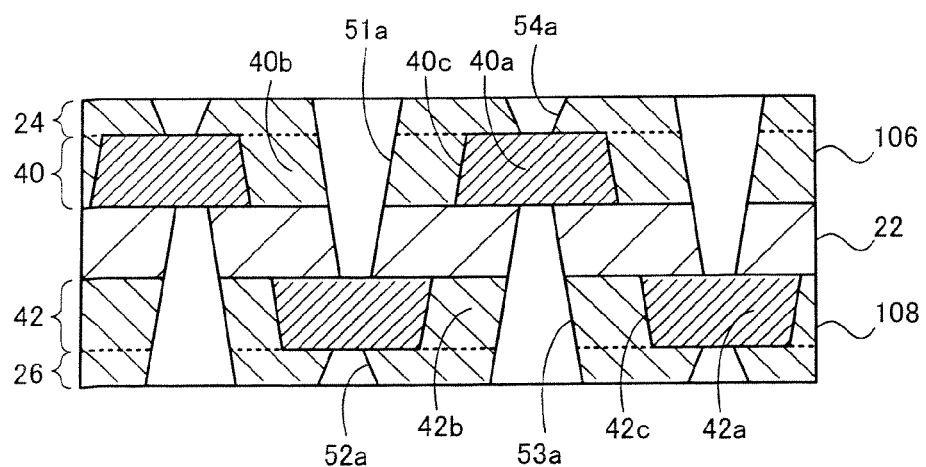
FIG. 8 is a cross-sectional view showing the procedure of manufacturing the multilayer core board.

Subsequently, the insulating films 106 and 108 which are formed of thermosetting resin of 40 μm to 250 μm in thickness and contain no glass cloth, but glass filler so as to perfectly cover the ground layer 40 and the power source layer 42 is laminated by a vacuum laminating method (see FIG. 7). Accordingly, the taper holes 40c and 42c are filled with parts of the insulating films 106 and 108 and become the non-conductive portions 40b and 42b. As a result, the ground layer 40 is constructed by the conductive portions 40a and the non-conductive portions 40b, and the power source layer 42 is constructed by the conductive portions 42a and the non-conductive portions 42b. Furthermore, the portion of the insulating film 106 which is laminated on the ground layer 40 becomes the first insulating layer 24, and the portion of the insulating film 108 which is laminated on the power source layer 42 becomes the second insulating layer 26. The via holes 51a are formed by carbon dioxide gas laser, UV laser, YAG laser, excimer layer or the like so that the diameter thereof is gradually reduced until the via holes 51a pass from the outer surface of the first insulating layer 24 through the first insulating layer 24, the non-conductive portions 40 of the ground layer 40b and the center insulating layer 22 and reach the conductive portions 42a of the power source layer 42, and also the via holes 54a are formed so that the diameter thereof is gradually reduced until the via holes 54a pass from the outer surface of the first insulating layer 24 through the first insulating layer 24 and reach the conductive portions 40a of the ground layer 40. Likewise, the via holes 53a are formed by carbon dioxide gas laser, UV laser, YAG laser, excimer laser or the like so that the diameter thereof is gradually reduced until the via holes 53a pass from the outer surface of the second insulating layer 26 through the second insulating layer 26, the non-conductive portions 42b of the power source layer 42 and the center insulating layer 22 and reach the conductive portions 40a of the ground layer 40, and also the via holes 52a are formed so that the diameter thereof is gradually reduced until the via holes 52a pass from the outer surface of the second insulating layer 26 through the second insulating layer 26 and reach the conductive portions 42a of the power source layer 42 (see FIG. 8). Since each of the via holes 51a to 54a is formed by laser, the via holes can be easily designed in a tapered shape or the hole diameter can be reduced.

Figure 9:
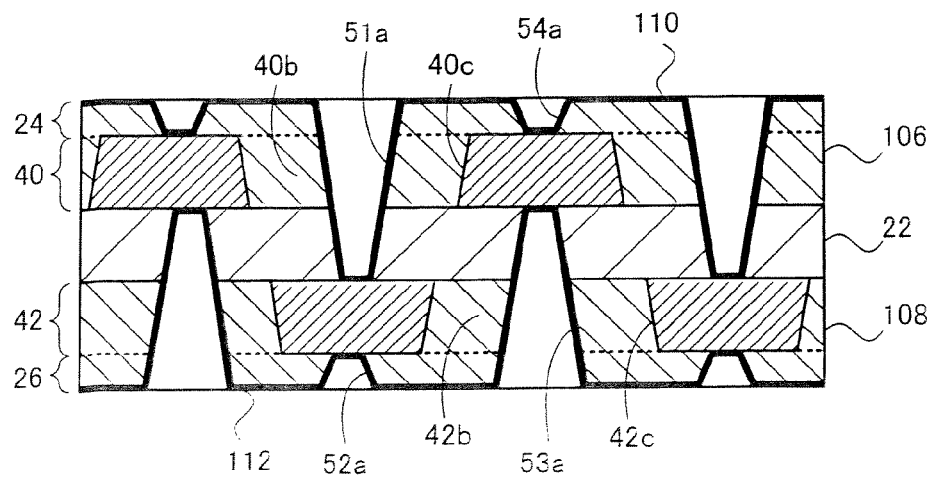
FIG. 9 is a cross-sectional view showing the procedure of manufacturing another printed wiring board.
Figure 10:
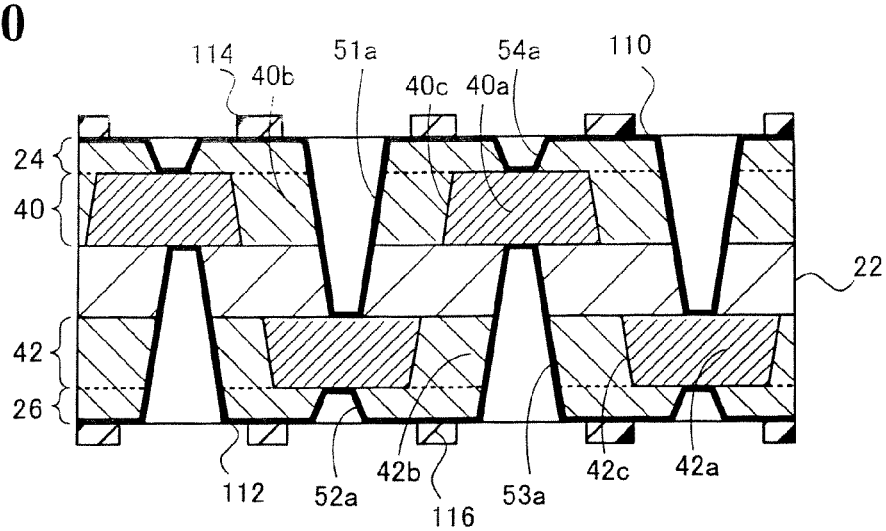
FIG. 10 is a cross-sectional view showing the procedure for manufacturing the multilayer core board.
Figure 11:
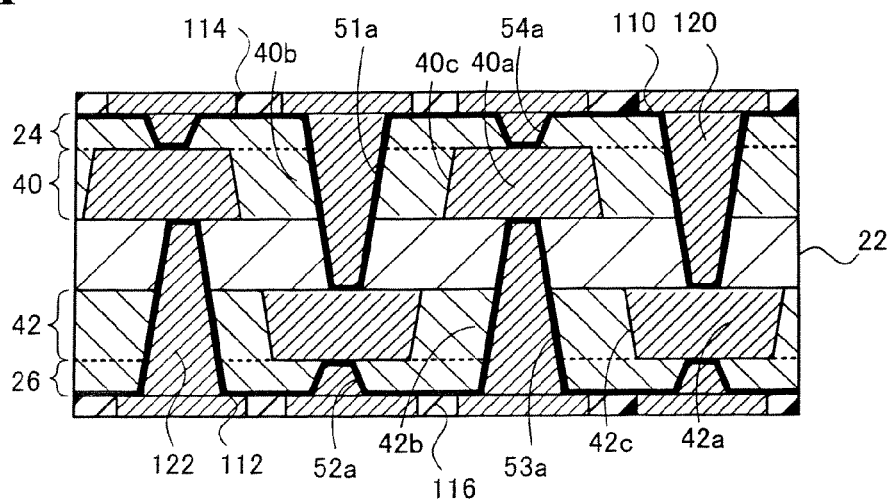
FIG. 11 is a cross-sectional view showing the procedure for manufacturing the multilayer core board.
Figure 12:
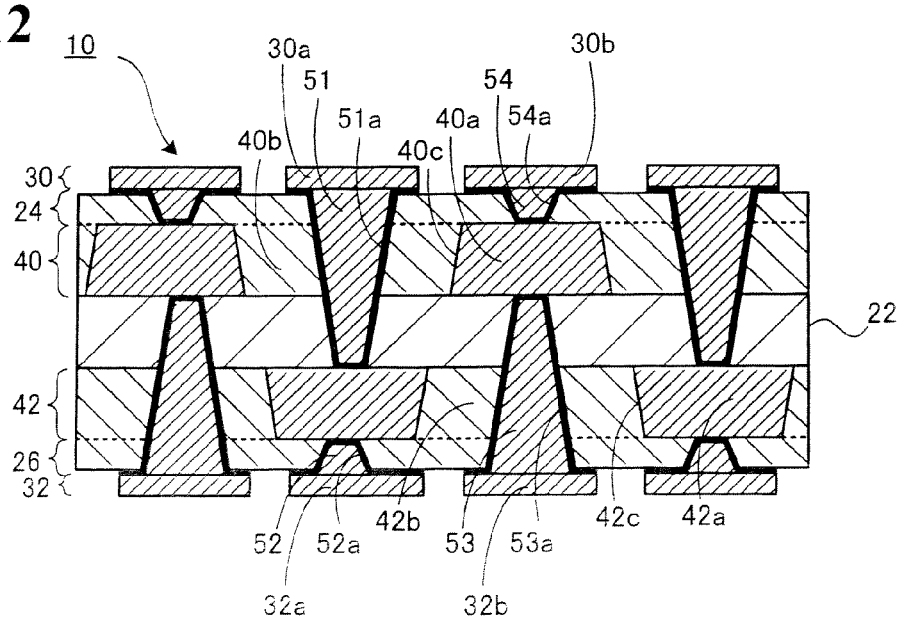
FIG. 12 is a cross-sectional view showing the procedure for manufacturing the multilayer core board.

Subsequently, after the inner walls of the via holes 51a to 54a are roughened by a permanganate method, catalyst is provided to the overall surface and then electroless copper plating is carried out on both surfaces of the board to thereby form electroless copper plating layers 110 and 112 (see FIG. 9). At this time, since the first and second insulating layers 24 and 26, the non-conductive portions 40b of the ground layer 40 and the non-conductive portions 42b of the power source layer 42 contain no glass cloth, there is no infiltration of plating along the glass in the plating step and thus the insulation performance can be prevented from being degraded. Furthermore, the inner walls of the via holes 51a to 54a are roughened, and thus the electroless copper plating layers 110 and 112 covering the inner walls are likewise brought about with roughened surfaces. Subsequently, a photoresist is formed on the electroless copper plating layers 110 and 112, exposed to light through a pattern mask and then developed so that the respective via holes 51a, 52a, 53a, 54a and the surroundings thereof in the electroless copper plating layers 110 and 112 are exposed, thereby forming patterned resists 114 and 116 (see FIG. 10). Electroless copper plating is carried out on the non-formation portion of the patterned resists 114 and 116 (that is, the exposed portion) to form the electroless copper plating layers 120 and 122 (see FIG. 11). Thereafter, the patterned resists 114 and 116 are exfoliated, and the electroless copper plating layers 110 and 112 at the portion where the patterned resists 114 and 116 existed are removed by etching. As a result, the respective via holes 51a, 52a, 53a and 54a are filled with copper (electroless copper plating layer+electrolytic copper plating layer), whereby the first to fourth via hole conductors 51, 52, 53, and 54 are formed and also the first conductive layer 30 and the second conductive layer 32 are formed at the surface side and the back surface side (see FIG. 12). Furthermore, the power source pads 30a and the ground pads 30b are alternately juxtaposed with one another in the first conductive layer 30, and the power pads 32a and the ground pads 32b are alternately juxtaposed with one another in the second conductive layer 32, thereby achieving the multilayer core board 10.

Since the inner walls of the via holes 51a to 54a are roughened, minute unevenness is formed on the surfaces of the first via hole conductors 51 which face the conductive portions 40a of the ground layer 40 and the surfaces of the third via hole conductors 53 which face the conductive portions 42a of the power source layer 42.

Figure 13:
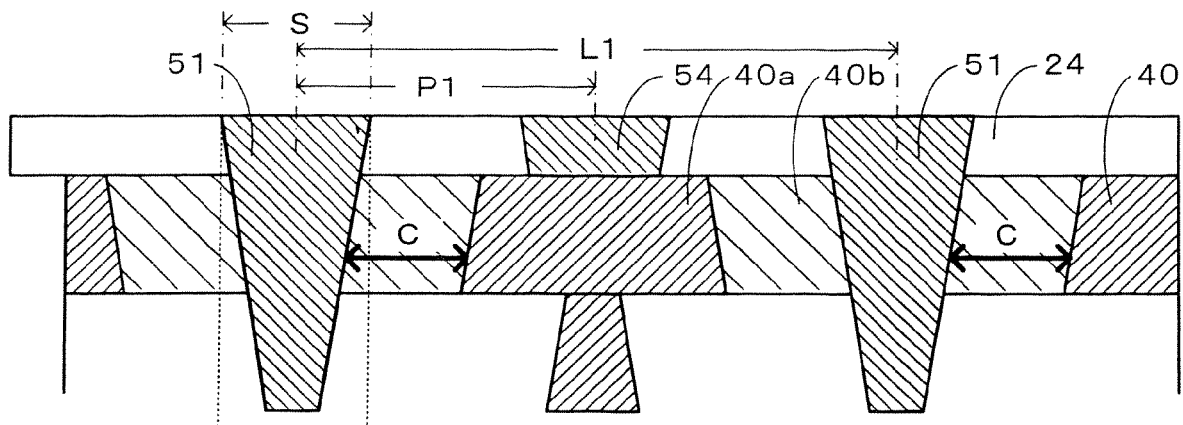
FIG. 13 is a diagram showing the pitch between the via holes of a tapered via hole conductor and a straight-shaped via hole conductor.
Figure 13:
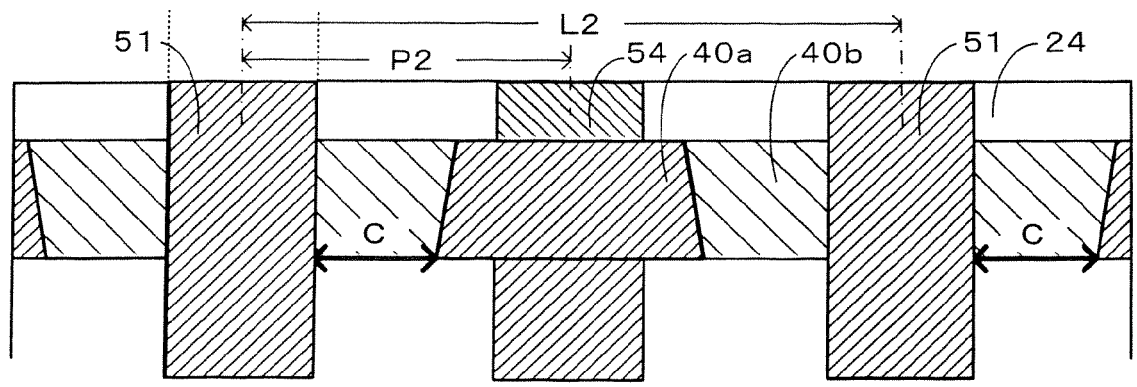

In the multilayer core board 10 of this embodiment described above, the first via hole conductors 51 and the conductive portion 42a of the power source layer 42 and the second via hole conductors 52 serving as positive poles and the third via hole conductors 53, the conductive portions 40a of the ground layer 40 and the fourth via hole conductors 54 serving as negative poles serve as through hole conductors respectively penetrating through the multilayer core board 10 in the vertical direction. The non-conductive portions 40b of the ground layer 40 and the non-conductive portions 42b of the power source layer 42 correspond to so-called clearance holes. Here, as shown in FIG. 13, when comparing the case where the shape of the first via hole conductors 51 is a tapered shape and the case where the shape of the first via hole conductor 51 is a straight shape on the assumption that the area of each of the first via hole conductors 51 is set to a predetermined size 1 and the clearance is set to such a predetermined distance C that the electrical insulation between the first via hole conductor 51 and the conductive portion 40a, the cross-sectional area of a portion of the first via hole conductor 51 which passes through the non-conductive portions 40b of the ground layer 40 is smaller in the case of the tapered first via hole conductor 51 than in the case of the straight-shaped via hole conductor 51, and thus the first via hole conductor 51 can be made closer to the adjacent conductive portion 40a. Therefore, in the case of the tapered first via hole conductors 51, the interval between the adjacent first via hole conductors 51 is shorter than in the case of the straight-shaped first via hole conductors 51 (L1<L2). This is applicable to the third via hole conductors 53 at the back surface side. Accordingly, the pitch of the first via hole conductors 51 at the positive pole side and the fourth via hole conductors 54 at the negative pole side which are alternately juxtaposed with one another can be sufficiently reduced (P1<P2). As a result, the loop inductance is reduced, and thus the impedance is reduced, so that the delay in the power supply to the transistors of the mounted IC chip 60 can be suppressed.

For the first conductive layer 30, the inter-terminal distance of the power source terminal 60a and the ground terminal 60b of the flip-chip mounted IC chip 60 and the inter-pad distance of the multiplayer core board 10 are coincident with each other, and thus the IC chip 60 can be mounted on the multiplayer core board 10 without drawing wires around in the horizontal direction. Therefore, the wire length of the power source and the ground wire length of the IC chip 60 can be shortened. As a result, the loop inductance is reduced and the impedance is reduced, so that the delay in the power supply to the transistors of the mounted IC chip 60 can be further suppressed.

The first via hole conductors 51 are designed so that the ratio d1/D1 of the small bottom diameter d1 and the large top diameter D1 satisfy $0.1 \leq d1/D1 \leq 0.9$, and the third via hole conductors 53 are designed so that the ratio d3/D3 of the small bottom diameter d3 and the large top diameter D3 satisfy $0.1 \leq d3/D3 \leq 0.9$. Therefore, both the reliability of the electrical connection and the electrical insulation when the pitch between the via holes is sufficiently narrowed can be secured. If the ratio d1/D1 or the ratio d3/D3 is out of the above range, the IC chip is liable to malfunction, and thus this condition is unfavorable. Particularly, if the ratio is less than 0.1, the bottom diameters d1 and d3 are small, and thus the connection resistance (area resistance) and the conductor resistance (volume resistance) are increased, so that there is a risk that power is not instantaneously supplied when the voltage of the transistors is lowered, and exfoliation may occur at the bottom. Therefore, this is unfavorable.

The ground layer 40 and the power source layer 42 are designed to be thicker than the first conductive layer 30 and the second conductive layer 32, so that the electrical resistance values of the power source wire and ground wire are lowered, and the power supply to the transistors of the mounted IC chip 60 is stabilized. Furthermore, the strength of the multiplayer core board 10 is increased by the thick ground layer 40 and the power source layer 42.

The surfaces of the conductive portions 40a of the ground layer 40 at the negative pole side which face the first via hole conductors 51 at the positive pole side are designed as slant surfaces having substantially the same taper angle as the tapered first via hole conductor 51, and thus the facing distance is longer as compared with a case where these surfaces are vertical surfaces. The surfaces of the conductive portions 42a of the power source layer 42 at the positive pole side which face the third via hole conductors 53 at the negative pole side are also designed as slant surfaces having substantially the same taper angle as the tapered third via hole conductors 53. Therefore, the facing distance is longer as compared with the case where these surfaces are vertical surfaces. Here, as the facing distance between the negative pole side and the positive pole side is longer, the loop inductance is further reduced and the impedance is smaller, so that when the voltage of the transistor of the IC chip 60 drops, the power can be instantaneously supplied.

Furthermore, minute unevenness is formed on the surface of the conductive portion 40a of the ground layer 40 which faces the first via hole conductor 51 and the surface of the first via hole conductor 51 which faces the conductive portion 40a, and also minute unevenness is formed on the surface of the conductive portion 42a of the power source layer 42 which faces the third via hole conductor 53 and the surface of the third via hole conductor 53 which faces the conductive portions 42a. Therefore, the facing area between the positive side and the negative side is increased, and the loop inductance is reduced, so that the impedance is reduced. This effect can be achieved when unevenness is formed on any one of the surface of the conductive portion 40a of the ground layer 40 which faces the first via hole conductor 51 and the surface of the first via hole conductor 51 which faces the conductive portion 40a, and unevenness is formed on any one of the facing surface of the first via hole conductor 51 and the conductive portion 40a of the ground layer 40 and the facing surface of the third via hole conductor 53 and the conductive portion 42a of the power source layer 42. As described above, the surface area can be made larger in a case where unevenness is formed on both facing surfaces as described above, and this case is favorable.

The present invention is not limited to the above embodiment, and various modifications may be made without departing from the technical scope of the present invention.

For example, in the above embodiment, one ground layer 40 and one power source layer 42 are provided in the multilayer core board 10. However, a plurality of ground layers 40 and a plurality of power source layers 42 may be alternately provided in the thickness direction.

In the above embodiment, the taper holes 40c and 42c are provided in the ground layer 40 and the power source layer 42. However, straight holes may be provided.

Figure 16:
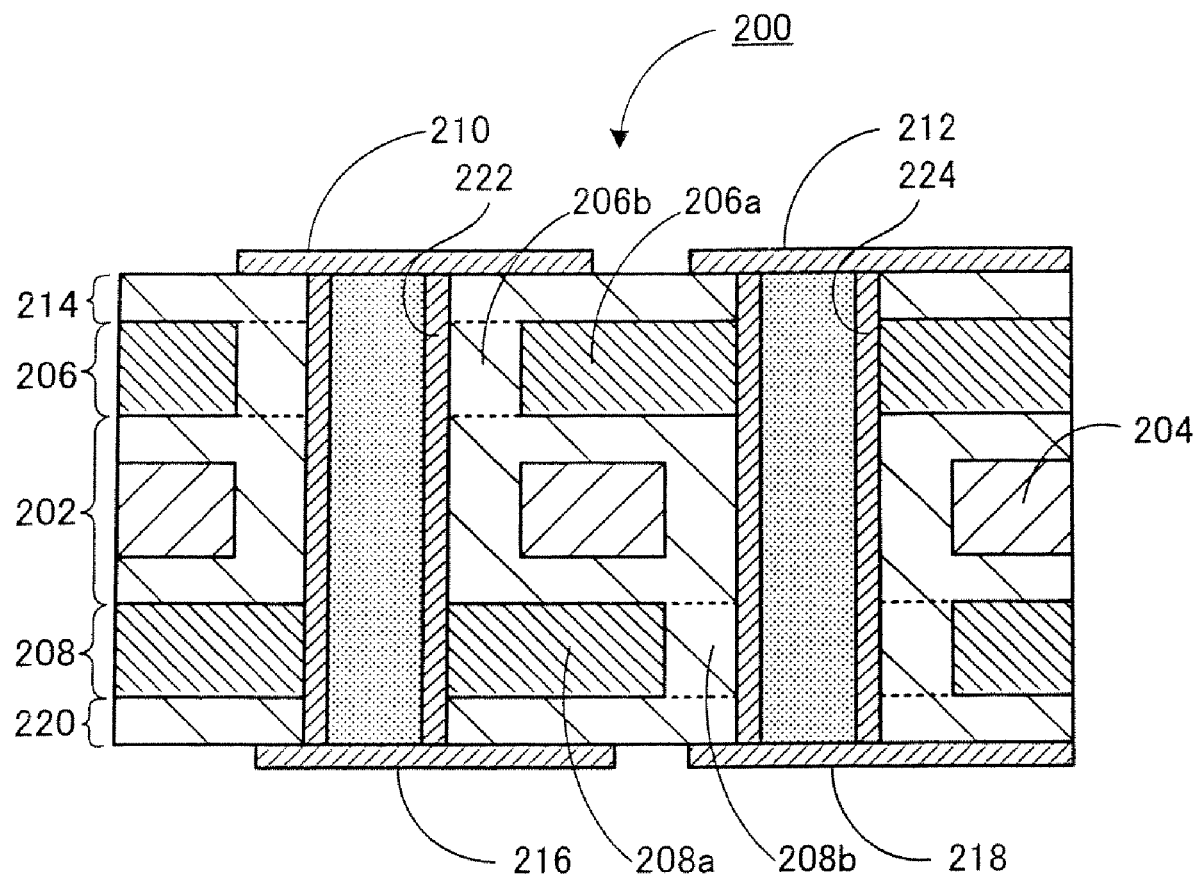
FIG. 16 is a cross-sectional view showing a conventional multilayer core board.

In the above embodiment, no metal core is provided. However, the same metal core as the metal core 204 of prior art example of FIG. 16 may be provided.

EXAMPLES

Experimental examples for demonstrating the effect of the multilayer core board 10 will be now described.

[Conducting Test after HAST]

Figure 14:
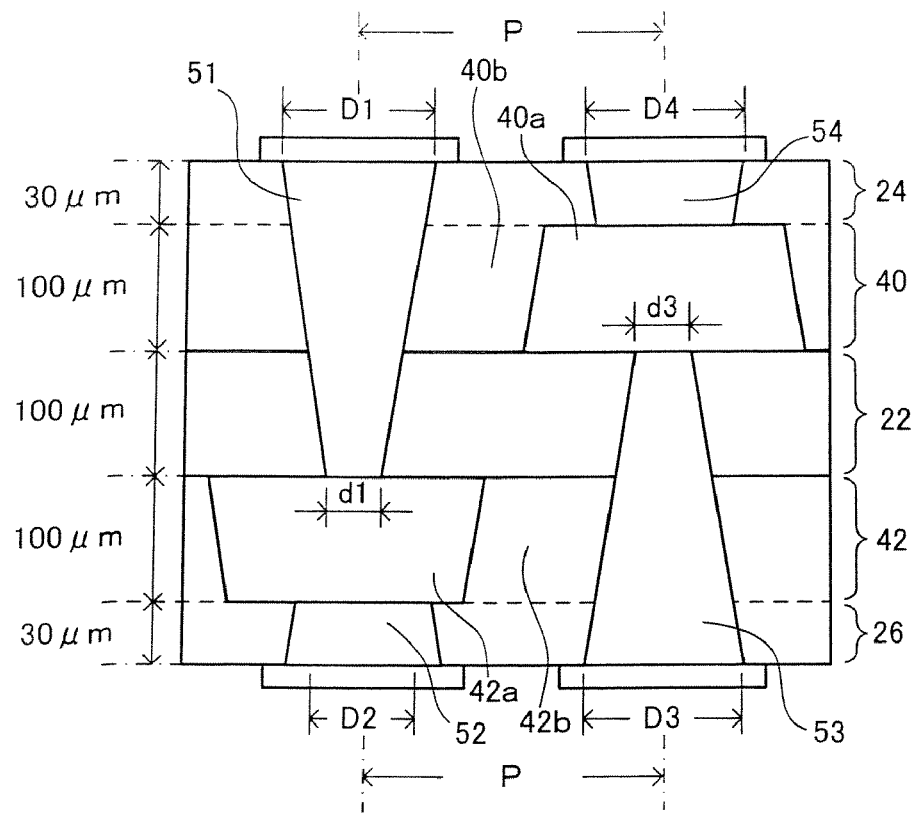
FIG. 14 is a diagram showing the dimensions of multilayer core boards of experiment examples 1 to 5.

First, the multilayer core boards 10 of examples 1 to 5 were manufactured according to the procedure of the manufacturing method of the above embodiment. Specifically, the multilayer core boards 10 of the examples 1 to 5 were manufactured so that as shown in FIG. 14, the thickness of each of the center insulating layer 22, the ground layer 40 and the power source layer 42 was equal to 100 µm, the height of the first and third via hole conductors 51 and 53 was equal to 230 µm, the thickness of the first and second insulating layers 24 and 26 was equal to 30 µm, the height of the second and fourth via hole conductors 52 and 54 was equal to 30 µm, and the pitch P between the via holes of the first via hole conductor 51 and the fourth via hole conductor 54 and the pitch P between the via holes of the second via hole conductor 52 and the third via hole conductor 53 were equal to 175 µm, and the dimensions of the conductive portions 40a and non-conductive portions 40b of the ground layer 40 and the dimensions of the conductive portions 42a and non-conductive portions 42b of the power source layer 42 are made common, and the bottom diameter values d1 and d3 of the first and third via hole conductors 51 and 53 were set as shown in Table 1.

Figure 15:
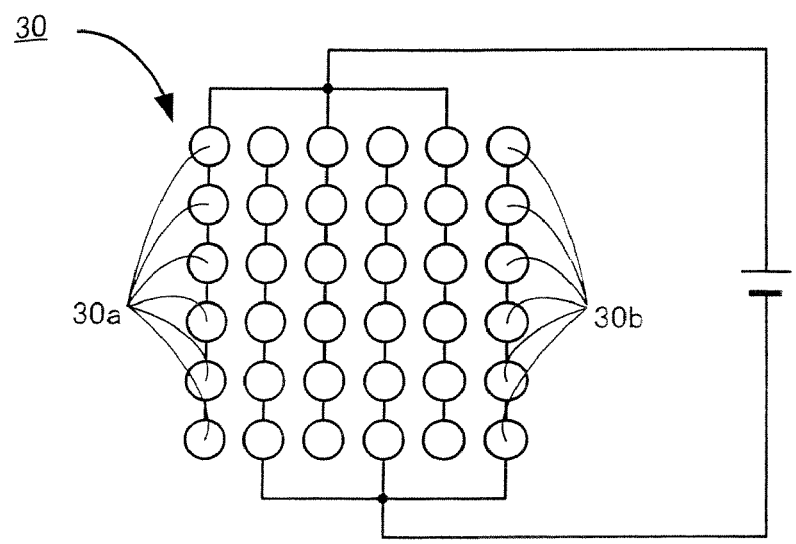
FIG. 15 is a diagram showing a conduction test after HAST.

Subsequently, predetermined HAST (Highly Accelerated Temperature and Humidity Stress Test) was carried out and then an insulation reliability test was carried out with respect to the prepared multilayer core boards. Specifically, as shown in FIG. 15, a voltage of 3.3V was applied between all the power source pads 30a and a terminal for wire-connecting all the ground pads 30b in the first conductive layer 30 of the multilayer core board 10, and the application of the voltage concerned was continued for 100 hours under a condition of 85° C. in temperature and 85% in humidity. Thereafter, the insulating resistance between both wire-connecting terminals was measured, and if the resistance value was equal to $1 \times 10^7 \Omega$ or more, it would be judged that insulation reliability can be secured. As a result, in the examples 2 to 4 in which the ratio of bottom diameter/top diameter ranged from 0.10 to 0.90, the insulation reliability could be secured. On the other hand, in the example 1 in which the ratio of bottom diameter/top diameter was equal to 1.00, the clearance between the first via hole conductor 51 and the conductive portion 40a of the ground layer 40 and the clearance between the third via hole conductor 53 and the conductive portion 42a of the power source layer 42 could not be sufficiently secured. Therefore, the insulation reliability could not be secured. In the example 5 in which the ratio of bottom diameter/top diameter was equal to 0.05, the insulation reliability could not be secured. It is estimated by the example 5 that exfoliation occurred between the bottom portions of the via hole conductors 51 and 53 and the conductive portions 40a and 42a by HAST, and it was developed so that exfoliation also occurred between the first insulating layer 24 and the center insulating layer 22 and between the second insulating layer 26 and the center insulating layer 22, resulting in infiltration of water into the exfoliation portion and thus reduction in the insulating resistance.

TABLE 1

| | Shape of Via Hole Conductor | | | | |
|---|---|---|---|---|---|
| Example | Top Diameter (D1~D4) | Bottom Diameter (d1, d3) | Ratio (d1/D1, d3/D3) | Pitch P | Result of Insulation Reliability Test After HAST |
| 1 | 100 µm | 100 µm | 1.00 | 175 µm | X |
| 2 | 100 µm | 90 µm | 0.90 | 175 µm | ◯ |
| 3 | 100 µm | 50 µm | 0.50 | 175 µm | ◯ |
| 4 | 100 µm | 10 µm | 0.10 | 175 µm | ◯ |
| 5 | 100 µm | 5 µm | 0.05 | 175 µm | X |

[Loop Inductance Measurement]

According to the procedure of the manufacturing method of the above embodiment, multilayer core boards 10 of examples 6 to 14 were manufactured. Specifically, as shown in FIG. 14, the multilayer core boards 10 of the examples 6 to 14 were manufactured so that the thickness of each of the center insulating layer 22, the ground layer 40 and the power source layer 42 was equal to 100 μm, the height of the first and third via hole conductors 51 and 53 was equal to 230 μm, the thickness of the first and second insulating layers 24 and 26 was equal to 30 μm, the height of the second and fourth via hole conductors 52 and 54 was equal to 30 μm, the dimension of the conductive portions 40a of the ground layer 40 and the dimension of the conductive portions 42a of the power source layer 42 were common to each other, and the pitch P between the via holes of the first via hole conductor 51 and the fourth via hole conductor 54, the pitch P between the via holes of the second via hole conductor 52 and the third via hole conductor 53, and the bottom diameters d1 and d3 of the first and third via hole conductors 51 and 53 were set to values shown in Table 1. At least 15 μm was needed for the clearance between the first via hole conductor 51 and the conductive portion 40a of the ground layer 40 and the clearance between the third via hole conductor 53 and the conductive portion 42a of the power source layer 42, and thus they were commonly set to 20 μm.

Subsequently, the loop inductance was measured. Specifically, as shown in FIG. 1, build-up layers 70 and 90 were formed on both surfaces of the multilayer core board 10. Then, a chip capacitor (not shown) was connected to a connection terminal provided to the outermost layer of the build-up layer 90 which was electrically connected to the input terminal provided to the outermost layer of the build-up layer 70 (the terminal connected to the first and second via hole conductors 51 and 52), and a connection terminal provided to the outermost layer of the build-up layer 90 which is electrically connected to the output terminal provided to the outermost layer of the build-up layer 70 (the terminal connected to the third and fourth via hole conductors 53 and 54). Under this state, alternating current of 30 MHz to 6 GHz was input into the input terminal, and the loop inductance extending from the input terminal through the wire of the build-up layer 70, the first and second via hole conductors 51 and 52 of the multilayer core board 10, the wire of the build-up layer 90, the chip capacitors, the wire of the build-up layer 90, the third and fourth via hole conductors 53 and 54 of the multilayer core board 10 and the wire of the build-up layer 70 and then reaching the output terminal was measured by a network analyzer (manufactured by Agilent Technologies Company). As a result, in the examples 9 to 13, the loop inductance is equal to 4 pH (pico henry) or less, and even when an IC chip whose FSB (front side bus) is high speed (400 MHz to 6 GHz), delay in the power supply to the transistors of the IC chip 60 hardly occurs. On the other hand, in the examples 6 to 8 and 14, the loop inductance is equal to 4 to 11 pH, and when the IC chip 60 having high speed (about 133 MHz) FSB is mounted, the delay in the power supply to the transistors of the IC chip 60 hardly occurs.

As a result of the examples 6 to 13, with respect to the pitch P and the loop inductance, the loop inductance tends to decrease as the pitch P decreases. However, the loop inductance conversely increases in the example 14. It is estimated that this is caused by increase of the self-inductance due to reduction of the conductor volume of the via hole conductor or electrical resistance when current flows from the ground layer or power source layer to the via hole conductors.

TABLE 2

| | Shape of Via Hole Conductor | | | | |
|---|---|---|---|---|---|
| Example | Top Diameter (D1~D4) | Bottom Diameter (d1, d3) | Ratio (d1/D1, d3/D3) | Pitch P | Loop Inductance |
| 6 | 300 μm | 150 μm | 0.50 | 500 μm | 11 |
| 7 | 250 μm | 125 μm | 0.50 | 400 μm | 9.1 |
| 8 | 200 μm | 100 μm | 0.50 | 300 μm | 6.3 |
| 9 | 200 μm | 100 μm | 0.50 | 250 μm | 3.3 |
| 10 | 125 μm | 63 μm | 0.50 | 175 μm | 3.0 |
| 11 | 100 μm | 50 μm | 0.50 | 150 μm | 2.5 |
| 12 | 50 μm | 40 μm | 0.80 | 100 μm | 1.8 |
| 13 | 40 μm | 30 μm | 0.75 | 80 μm | 1.6 |
| 14 | 30 μm | 20 μm | 0.67 | 70 μm | 4.2 |

What is claimed is:

1. A method for manufacturing a multilayer core board comprising the steps of:
 (a) patterning conductive thick film provided on both surfaces of a center insulating layer to form a ground layer and a power source layer respectively having conductive portions and hole portions;
 (b) covering the whole of the ground layer with insulating material while filling the hole portions of the ground layer with the insulating material to form non-conductive portions, thereby forming a first insulating layer, and covering the whole of the power source layer with insulating material while filling the hole portions of the power source layer with the insulating material to form non-conductive portions, thereby forming a second insulating layer;
 (c) forming first via holes by using a laser so that the first via holes pass through the first insulating layer, the non-conductive portions of the ground layer and the center insulating layer and reach the conductive portions of the power source layer without exposing the conductive portions of the ground layer, while the first via holes are gradually reduced in diameter from the outer surface of the first insulating layer, forming second via holes by using a laser so that the second via holes pass from the outer surface of the second insulating layer through the second insulating layer and reach the conductive portions of the power source layer, forming third via holes by using a laser so that the third via holes pass through the second insulating layer, the non-conductive portions of the power source layer and the center insulating layer and reach the conductive portions of the ground layer without exposing the conductive portions of the power source layer, while the third via holes are gradually reduced in diameter from the outer surface of the second insulating layer, where the third via holes and the second via holes are alternately juxtaposed with one another, and forming fourth via holes by using a laser so that the fourth via holes pass from the outer surface of the first insulating layer through the first insulating layer and reach the conductive portions of the ground layer;
 (d) covering at least inner walls of the first to fourth via holes with conductors to form first to fourth via holes conductors; and (e) forming a first conductive layer on the outer surface of the first insulating layer so as to be electrically connected to the first and fourth via hole conductors, and also forming a second conductive layer on the outer surface of the second insulating layer so as to be electrically connected to the second and third via hole conductors.

2. The multilayer core board manufacturing method according to claim 1, wherein in the step (c), the first via hole conductors and the third via hole conductors are formed so that the ratio d/D of a small bottom diameter d and a large top diameter D satisfies $0.1 \leq d/D \leq 0.9$.

3. The multilayer core board manufacturing method according to claim 1, wherein in the step (e), the first conductive layer and the second conductive layer are formed so that the ground layer and the power source layer are thicker than the first conductive layer and the second conductive layer.

4. The multilayer core board manufacturing method according to claim 1, wherein in the step (c), surfaces of the conductive portions of the ground layer that face the first via hole conductors are designed to be tapered surfaces having substantially the same taper angle as the first via hole conductors, and surfaces of the conductive portions of the power source layer that face the third via hole conductors are designed to be tapered surfaces having substantially the same taper angle as the third via hole conductors.

5. The multilayer core board manufacturing method according to claim 1, wherein in the step (c), unevenness is formed on at least either surfaces of the conductive portions of the ground layer that face the first via hole conductor or surfaces of the conductive portions of the first via hole conductors that face the conductive portions of the ground, and unevenness is formed on at least either surfaces of the conductive portions of the power source layer that face the third via hole conductors and surfaces of the third via hole conductors that face the conductive portions of the power source layer.

* * * * *